(12) United States Patent
Akimoto et al.

(10) Patent No.: US 8,962,981 B2
(45) Date of Patent: *Feb. 24, 2015

(54) SOLAR CELL DEVICE AND MANUFACTURING METHOD THEREFOR

(75) Inventors: Yuji Akimoto, Fukuoka (JP); Masami Nakamura, Kunitachi (JP); Naoto Shindo, Ome (JP); Tadashi Kanasaku, Kokubunji (JP)

(73) Assignee: Shoei Chemical Inc., Shinjuku-Ku, Tokyo (JP)

( * ) Notice: Subject to any disclaimer, the term of this patent is extended or adjusted under 35 U.S.C. 154(b) by 469 days.

This patent is subject to a terminal disclaimer.

(21) Appl. No.: 12/925,344

(22) Filed: Oct. 20, 2010

(65) Prior Publication Data
US 2011/0094578 A1    Apr. 28, 2011

(30) Foreign Application Priority Data
Oct. 28, 2009   (JP) .................................. 2009-247221

(51) Int. Cl.
*H01L 31/00*    (2006.01)
*H01L 31/0224*  (2006.01)
*H01B 1/22*     (2006.01)

(52) U.S. Cl.
CPC .......... *H01L 31/022425* (2013.01); *H01B 1/22* (2013.01); *Y02E 10/52* (2013.01)
USPC ....................................................... 136/256

(58) Field of Classification Search
CPC .............................................. H01L 31/022425
USPC ........................................... 136/256; 438/98
See application file for complete search history.

(56) References Cited

U.S. PATENT DOCUMENTS

| 2005/0130547 A1* | 6/2005 | Oida et al. ........................ 445/24 |
| 2009/0188555 A1* | 7/2009 | Castillo et al. ................ 136/256 |
| 2009/0189126 A1* | 7/2009 | Prunchak ................ 252/519.51 |
| 2011/0232746 A1* | 9/2011 | Carroll et al. ................. 136/256 |

FOREIGN PATENT DOCUMENTS

| CN | 101503277 A | 8/2009 |
| JP | 02-293344 | 12/1990 |
| JP | 04-270140 | 9/1992 |
| JP | 10-029834 | 2/1998 |
| JP | 10-326522 | 12/1998 |

(Continued)

OTHER PUBLICATIONS

Canadian Office Action dated Sep. 20, 2012 (3 pages).

(Continued)

*Primary Examiner* — Allison Bourke
(74) *Attorney, Agent, or Firm* — Flynn, Thiel, Boutell & Tanis, P.C.

(57) ABSTRACT

A solar cell device including an electrode formed by applying a conductive paste containing at least a conductive powder, glass frit and an organic vehicle onto a semiconductor substrate provided with a silicon nitride layer on a surface thereof and firing the applied conductive paste, wherein the electrode has a structure with a front electrode layer containing silver as a main component, a glass layer containing tellurium glass as a main component, and a silicon oxide layer containing plural silver particles precipitated by the firing. The solar cell device is provided with an electrode formed using a conductive paste not containing lead glass and has good solar cell characteristics.

5 Claims, 2 Drawing Sheets

(56) References Cited

FOREIGN PATENT DOCUMENTS

| | | |
|---|---|---|
| JP | 11-213754 | 8/1999 |
| JP | 2001-093326 | 4/2001 |
| JP | 2001-118425 | 4/2001 |
| JP | 2004-207493 | 7/2004 |
| JP | 2007-008802 | 1/2007 |
| JP | 2008-543080 | 11/2008 |
| JP | 2009-194121 | 8/2009 |
| JP | 2009-209032 | 9/2009 |
| JP | 2010-184852 | 8/2010 |
| WO | WO 2009/097264 | 8/2009 |
| WO | WO 2010/016186 | 2/2010 |

OTHER PUBLICATIONS

Japanese Office Action dated May 16, 2012, including English relevant parts.

Japanese Office Action dated Jul. 20, 2012, including English relevant parts.

\* cited by examiner

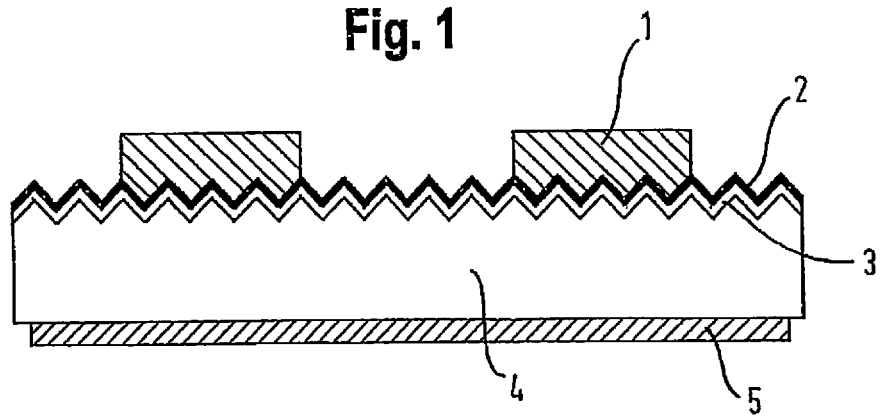
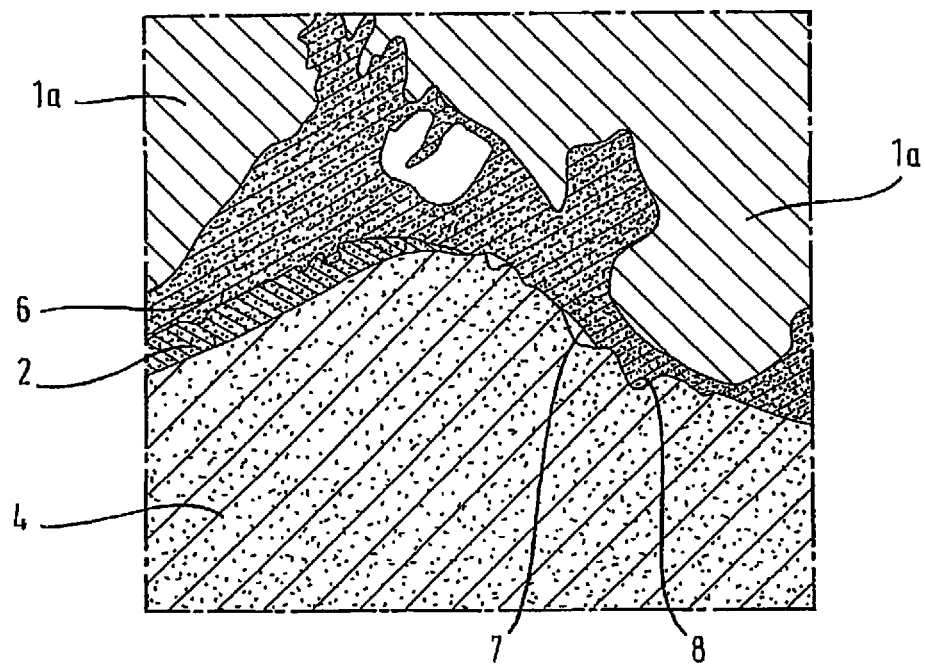

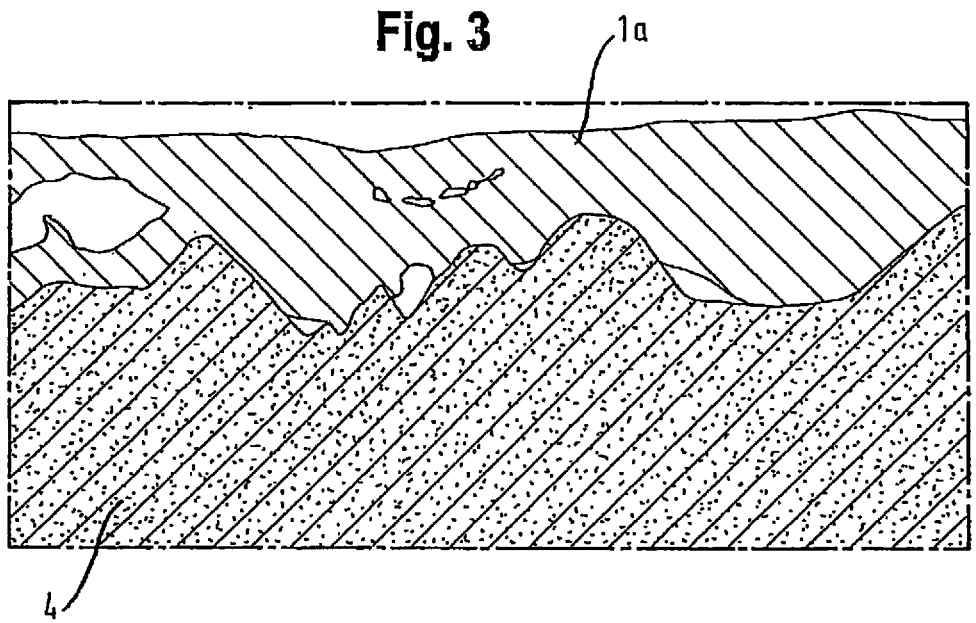
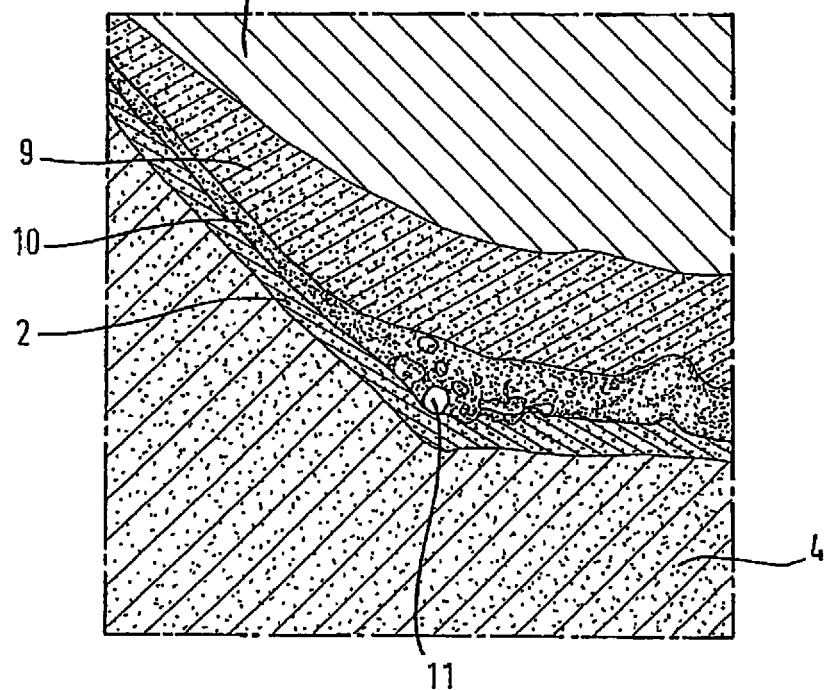

SOLAR CELL DEVICE AND MANUFACTURING METHOD THEREFOR

BACKGROUND OF THE INVENTION

1. Field of the Invention

The present invention relates to a solar cell device provided with an electrode formed using a fired-type conductive paste containing glass frit and a conductive powder comprising silver as a main component, and to a manufacturing method therefor.

2. Description of the Related Art

Conventionally, an ordinary solar cell device is provided with a silicon semiconductor substrate, a diffusion layer, an antireflective film, a rear electrode and a front electrode (hereunder sometimes called a "light-receiving electrode"). When forming the front electrode in particular, the electrode is formed by screen printing, stencil printing or the like, using a conductive paste made by mixing conductive particles comprising silver as a main component with glass frit, an organic vehicle, etc.

As one example, in the crystalline silicon solar cell shown in FIG. 1, a diffusion layer 3 is formed in the front surface (light-receiving surface) area of a p-type crystalline silicon substrate 4, which is formed with a concave-convex surface structure called a textured structure. The diffusion layer 3, which is formed by diffusing an impurity such as phosphorus (P) into the semiconductor substrate 4 from the light-receiving surface thereof, is a region exhibiting the opposite conductivity type from the semiconductor substrate 4 (in the present example, the opposite conductivity type is explained as n-type). The n-type diffusion layer 3 is formed for example by placing the semiconductor substrate 4 in a diffusion furnace, and heating it in phosphorus oxychloride ($POCl_3$) or the like. An insulating antireflective film 2 is formed from silicon nitride, silicon oxide, titanium oxide or the like on this diffusion layer 3 to provide an antireflective function while at the same time protecting the solar cell device. In the case of silicon nitride (hereunder, "SiN") for example, the film is formed by plasma CVD or the like using a mixed gas of silane ($SiH_4$) and ammonia ($NH_3$). The antireflective film 2 is formed with a thickness of about 5 to 100 nm and a refractive index of about 1.8 to 2.3, taking into consideration the difference between this refractive index and that of the semiconductor substrate 4 and the like.

Next, the aforementioned conductive paste is printed or coated in a grid form on the antireflective film 2 by screen printing or the like, and fired at about 500 to 900° C. to form a front electrode 1. Normally, electrical contact between the front electrode 1 and the n-type diffusion layer 3 is achieved when antireflective film 2 is melted by the action of the glass frit in the conductive paste and removed during firing. This is commonly called "fire-through".

A rear electrode 5 is formed on the rear side of the semiconductor substrate 4 together with a highly concentrated p-type BSF (Back Surface Field) layer doped with aluminum or the like.

To achieve proper fire-through, glasses having good solubility with the antireflective film 2 have been preferably used as the glass frit in the conductive pastes. Among them, especially glass containing lead oxide has often been used for the glass frit in conventional conductive pastes for forming front electrodes because the glass softening point is easy to adjust and the glass provides good adhesiveness with the substrate (adhesive strength), allows for relatively good fire-through and results in superior solar cell characteristics.

For example, lead borosilicate glass frit is used in the silver pastes for forming solar cell electrodes described in Japanese Patent Publication Nos. 11-213754 A, 2001-093326 A and 10-326522 A, while Japanese Patent Publication No. 2001-118425 A describes lead borate glass frit in addition to lead borosilicate glass frit.

Regarding the aforementioned fire-through, however, problems with variation in adhesive strength and failure to obtain stable ohmic contact between the front electrode 1 and the n-type diffusion layer 3 of the semiconductor substrate 4 have occurred when the front electrode 1 does not penetrate through the antireflective film 2 due to variation in the effect of the glass frit and the like when the front electrode 1 is fired. Insufficient ohmic contact can cause loss during output, resulting in lower conversion efficiency of the solar cell and a decline in the current-voltage characteristics.

As described in paragraph [0004] of Japanese Patent Publication No. 10-326522 A, paragraph [0017] of Japanese Patent Publication No. 2004-207493 A, etc, meanwhile, there has been known another problem in which excessive fire-through may also produce inferior voltage characteristics. Since the antireflective film 2 can be no more than about 5 to 100 nm thick as described above, if the front electrode 1 penetrates through the antireflective film 2 and then through the n-type diffusion layer 3 below to intrude into the semiconductor substrate 4, the p-n junction may be broken, and the fill factor ("FF") obtained from the current-voltage characteristic measurements may be adversely affected. Such penetration may become more likely and harder to control if in the future the n-type diffusion layer 3 is made still thinner in an effort to improve efficiency.

FIG. 2 shows the interface between a front electrode and a semiconductor substrate of a commercial solar cell substrate as seen through a transmission electron microscope (TEM). Lead glass is used in the front electrode of this commercial solar cell. In FIG. 2, a lead glass layer 6 containing a silver component from the conductive paste is present between the front electrode layer 1a and the SiN layer 2, which is an antireflective film, and part 7 of this glass layer penetrates through the SiN layer 2 to contact a silicon substrate (or n-type diffusion layer) 4, but in part 8 there is too much fire-through, and the glass can be seen as protrusions intruding deeply into the interior of the semiconductor substrate 4.

As a separate issue, increased environmental awareness in recent years has led to a desire for a switchover to lead-free materials and parts in solar cells. Alternative materials and parts are therefore being developed that will provide ease of adjusting the softening point of the glass, good adhesiveness to the substrate (high adhesive strength) and good fire-through, as in the case of the conventional lead glass, with the aim of providing superior solar cell characteristics.

For example, attempts have been made to form front electrodes using zinc borosilicate glass frit in Japanese Patent Publication No. 2001-118425 A, bismuth borosilicate and zinc borosilicate glass frits in Japanese Patent Publication No. 10-326522 A, borosilicate glass frit in Japanese Patent Publication No. 2008-543080 A (Japanese translation of WO 2006/132766) and zinc borate glass frit in Japanese Patent Publication No. 2009-194121 A. However, the research of the present inventors has shown that even using such lead-free glass, fire-through is sometimes difficult to control, including cases of insufficient fire-through, failure to achieve ohmic contact, or, as in FIG. 2, excessive fire-through such that part of the front electrode intrudes deeply into the semiconductor substrate.

On the other hand, tellurium glass is known as a glass for use in fluorescent display tube sealing applications (Japanese Patent Publication No. 10-029834 A) and optical fiber material applications (Japanese Patent Publication No. 2007-008802 A). In general, tellurium glass is known to have a low melting point, to be highly durable and to easily dissolve silver in solid solution, but it also has an extremely low reactivity with silicon oxide, and since silicon-type antireflective films have been popular in recent years, there has been little interest in tellurium glass for forming the front electrodes of solar cells.

SUMMARY OF THE INVENTION

It is an object of the present invention to provide a solar cell device having good solar cell characteristics while using a conductive paste not containing lead glass as the conductive paste for a front electrode formation, and to provide a manufacturing method therefor.

The present invention comprises the following.
(1) A solar cell device including an electrode formed by applying a conductive paste containing at least a conductive powder, glass frit and an organic vehicle onto a semiconductor substrate provided with a silicon nitride layer on a surface thereof and firing the applied conductive paste, wherein the electrode has a structure comprising a front electrode layer comprising silver as a main component, a glass layer comprising tellurium glass as a main component, and a silicon oxide layer containing plural silver particles precipitated by the firing.
(2) The solar cell device according to (1) above, wherein the silver particles are precipitated near the interface between the silicon oxide layer and the silicon nitride layer.
(3) The solar cell device according to (1) or (2) above, wherein the silver particles are fine particles with a particle size of less than or equal to 100 nm.
(4) A method for manufacturing a solar cell device, comprising forming the electrode described in any one of (1) to (3) above by applying a conductive paste containing at least a conductive powder comprising silver as a main component, tellurium glass frit and an organic vehicle on a semiconductor substrate provided with a silicon nitride layer on a surface thereof and firing the applied conductive paste.

With the present invention, it is possible to obtain a solar cell device having a performance and characteristics well comparable with or superior to those of conventional solar cells by forming the electrode using a conductive paste comprising silver as a main component and containing lead-free tellurium glass, without containing any lead glass in the conductive paste as in the past. Because there is little dependence on firing temperature and no problem of deep penetration into the semiconductor substrate by part of the front electrode due to excessive fire-through as in the past, moreover, it is easier to control firing during electrode formation, and the technology can also be applied to making thinner solar cells and thinner n-type diffusion layers.

BRIEF DESCRIPTION OF THE DRAWINGS

FIG. 1 is a diagram of a solar cell device.
FIG. 2 is a TEM photograph of the interface between a substrate and a front electrode using conventional lead glass.
FIG. 3 is a TEM photograph of the interface between a substrate and a front electrode using the Te glass of the present invention.

FIG. 4 is a TEM photograph of the interface between the substrate and the front electrode using the Te glass of the present invention.

DETAILED DESCRIPTION OF THE PREFERRED EMBODIMENTS

One embodiment of the conductive paste and solar cell device of the present invention is explained below, but the scope of the present invention is not limited thereto.

The conductive paste used in the present invention is explained first.

In the conductive paste used in the present invention, glass frit and a conductive powder comprising silver as a main component are dispersed in an organic vehicle. The individual components are explained below.

The conductive powder is not particularly limited as long as it contains silver as a main component, and may have a spherical-, flake- or dendrite-shape or the like as conventionally used. In addition to pure silver powder, it is possible to use silver-coated composite powder-having at least a silver layer on the surface thereof, an alloy comprising silver as a main component, or the like. The average particle size of the conductive powder is preferably 0.1 to 10μm. It is also possible to use a mixture of two or more conductive powders having different average particle sizes, particle size distributions, shapes or the like, or a mixture of silver powder with one or more conductive powders other than silver. There are no particular limitations on the metals that can be complexed, alloyed or mixed with the silver powder as long as the function effects of the present invention are not adversely affected, and examples include aluminum, gold, palladium, copper, nickel and the like. From the standpoint of conductivity however it is desirable to use pure silver powder.

The electrode-forming conductive paste used in the present invention is characterized in that tellurium glass having tellurium oxide as a network-forming component is used as glass frit. This is especially suited to forming the electrode on the front surface (light-receiving surface) of a solar cell, and an electrode providing superior solar cell characteristics can be obtained by printing this paste onto an antireflective film of silicon nitride, etc., on a solar cell surface and firing it.

In the tellurium glass (hereunder "Te glass") used in the present invention, tellurium oxide does not form glass by itself but is a network-forming component forming the principal structure of glass, and the content thereof is 25 to 90 mol % (as oxide) with respect to the total of the glass frit. When this content is below 25 mol % or above 90 mol % vitrification becomes difficult. The content range is preferably from 30 to 80 mol % and more preferably from 40 to 70 mol %.

The research of the present inventors has shown that when the front electrode of a solar cell is formed using the conductive paste containing Te glass, sufficient ohmic contact is achieved even without fire-through (penetration through the SiN layer), which has previously been considered necessary for achieving ohmic contact.

FIG. 3 shows the interface between a silicon substrate and a front electrode of the present invention as observed under a transmission electron microscope (TEM), while FIG. 4 shows an enlarged view of a part thereof. A Te glass layer 9 comprising a silver component is present between a front electrode layer 1a and a SiN layer 2, but the front electrode hardly penetrates through the SiN layer 2. Even in the few cases where penetration through the SiN layer 2 occurs, the penetration is limited to a very shallow region of the silicon substrate 4. A silicon oxide layer 10 with a series of precipitated fine silver particles 11 is present between the glass layer 9 and the SiN layer 2, resulting in a unique structure very different from a conventional structure such as that shown in FIG. 2. It is thought that in the solar cell device of the present invention, conduction occurs by a different conduction mechanism than in the past, since the various characteristics required of a solar cell device are achieved as discussed below even when there is very little penetration into the SiN layer 2 by front electrode layer 1a as in the present invention.

Although the details are unclear, the inventors suppose the following. Te glass has the property of dissolving silver very easily in solid solution, so that large quantities of silver are dissolved as ions in the Te glass during firing when the electrode is formed. Therefore silver ions thus dissolved in the glass subsequently diffuse gradually to the SiN layer 2 via the glass layer 9, promoting an oxidation-reduction reaction that converts part of the surface layer of the SiN layer 2 into silicon oxide 10 at the interface with the electrode, while precipitating as very fine silver particles 11. The presence of a silver component other than the silver particles 11 in the silicon oxide layer 10 has also been confirmed from the results of measurement with an energy dispersive X-ray spectroscopy (EDS). This suggests that in the electrode of the present invention, the silver component is contained at a high concentration between the front electrode and the n-type diffusion layer, so that even though there is almost no penetration through the SiN layer, sufficient ohmic contact is obtained between the front electrode and the n-type diffusion layer, resulting in superior solar cell properties.

Thus, by forming the front electrode of a solar cell using the conductive paste containing Te glass, it is possible to achieve the properties required of a solar cell device without penetrating through the antireflective film by the front electrode, and since there is no deep penetration into the semiconductor substrate even when the electrode penetrates through the antireflective film, further reduction in the thickness of the solar cell and further reduction in the thickness of the n-type diffusion layer, which are expected to be needed in the future, can be achieved.

In the Te glass of the present invention, tellurium oxide is a network-forming component that forms the network of the glass, and it is also desirable to include one or more of tungsten oxide and molybdenum oxide as a component that assists in glass network formation in addition to tellurium oxide.

Tungsten oxide and molybdenum oxide both contribute to expanding the vitrification range of the Te glass and stabilizing the glass. Vitrification is difficult if the combined content of these components as oxides is less than 5 mol % or more than 60 mold. The preferred range is 10 to 50 mol %.

One or more of zinc, bismuth and aluminum are preferably included in the Te glass of the present invention, and it is especially desirable to include these in combination with tungsten and/or molybdenum.

Zinc helps to expand the vitrification range and stabilize the glass, but vitrification becomes difficult if the content thereof as oxide exceeds 50 mol %. The preferred range is 5 to 30 mol %.

Bismuth helps to expand the vitrification range and improve chemical durability, but a crystal phase is likely to form if the content thereof as oxide exceeds 25 mol %, detracting from the stability of the glass. The preferred range is 0.5 to 22 mold.

Aluminum helps to improve the chemical durability of the glass, but when the addition thereof as oxide is above 25 mol %, a significant effect by the addition cannot be obtained. The preferred range is 2 to 20 mol %.

In addition, the alkali metal elements such as lithium and sodium, the alkali earth metal elements such as magnesium, calcium, strontium and barium and the other elements such as dysprosium, yttrium, niobium, lanthanum, silver, zirconium, titanium, boron, germanium, phosphorus and tantalum can be included alone or in combination thereof in the Te glass of the present invention in order to adjust its reactivity with the SiN layer and the solid dissolution amount of silver, and the total content of these as oxides is preferably 50 mol % or less.

Further, the Te glass of the present invention preferably has a softening point of 300 to 550° C. If the softening point is below 300° C., fire-through occurs more easily and the front electrode may penetrate through not only the SiN layer but also the n-type diffusion layer, increasing the risk of breaking the p-n junction. If the softening point exceeds 550° C., insufficient glass is supplied to the junction interface between the front electrode and the antireflective film, so that the aforementioned unique structure is not obtained, ohmic contact is impaired, and the adhesive strength of the electrode is diminished.

In addition to the aforementioned Te glass frit, glass frit other than the Te glass can be combined in the conductive paste used in the present invention. For purposes of controlling the firing temperature, reactivity to the SiN layer and the like and controlling the characteristics of the resulting solar cell device, glass chosen from among known glasses such as $SiO_2$—$B_2O_3$ glass, $SiO_2$—$B_2O_3$—$ZnO$ glass, $SiO_2$—$Bi_2O_3$ glass, $B_2O_3$—$ZnO$ glass, etc. can be combined with the Te glass as appropriate as the glass frit other than the Te glass, and it is especially desirable to include $SiO_2$—$B_2O_3$ glass or $SiO_2$—$B_2O_3$—$ZnO$ glass.

The glass frit in the conductive paste used in the present invention can be contained in an amount normally contained in conductive paste for forming solar cell electrodes, but for example 0.1 to 10 parts by weight per 100 parts by weight of conductive powder is preferred. If the amount of glass frit is less than 0.1 parts by weight per 100 parts by weight of conductive powder, the adhesiveness and electrode strength will be very low. If it exceeds 10 parts by weight, on the other hand, there will be problems with glass float on the electrode surface and increased contact resistance due to glass flowing into the interface.

In conventional conductive pastes for forming solar cell electrodes, a certain amount of glass frit must be added in order to achieve good fire-through, but in the conductive paste used in the present invention, the amount of glass frit can be reduced because ohmic contact is achieved by a different mechanism from conventional fire-through as discussed above. Since a highly conductive front electrode can be obtained by reducing the amount of glass, a more desirable amount of glass frit is 0.1 to 5 parts by weight per 100 parts by weight of conductive powder.

The average particle size of the glass frit added in the conductive paste used in the present invention is not particularly limited but is preferably 0.5 to 5.0 μm.

The conductive paste used in the present invention essentially contains no lead component, and specifically the lead content of the conductive paste is 1000 ppm or less.

One or more of plasticizers, viscosity adjusters, surfactants, oxidizers, metal oxides, organic metal compounds and the like commonly used as additives can be added as necessary in the conductive paste used in the present invention to the extent that they do not detract from the effects of the present invention.

A silver compound such as silver carbonate, silver oxide or silver acetate described in Japanese Patent Publication No. 2007-242912A, filed by the applicant, can also be added, and one or more of copper oxide, zinc oxide, titanium oxide and the like can also be added appropriately in order to control the firing temperature, improve solar cell characteristics and the like.

The conductive paste used in the present invention is formed by mixing the aforementioned conductive powder, glass frit and appropriate additives together with an organic vehicle to obtain a paste, paint or ink with a rheology suited to screen printing or other printing method.

The organic vehicle is not particularly limited, and an organic binder, solvent, etc. commonly used as a vehicle in silver paste can be selected and mixed as appropriate. Examples of organic binders include celluloses, acrylic resins, phenol resins, alkyd resins, rosin esters and the like, while examples of solvents include alcohols, ethers, esters, hydrocarbons and other organic solvents as well as water and mixed solvents of these. The amount of the organic vehicle is not particularly limited, and can be adjusted appropriately according to the application method to an amount suitable for retaining inorganic components such as the conductive powder and the glass frit in the paste, but is normally about 5 to 40 parts by weight per 100 parts by weight of the conductive powder.

The solar cell device of the present invention is manufactured for example as follows.

The semiconductor substrate is preferably of monocrystalline silicon or polycrystalline silicon, doped with boron or the like so that the substrate exhibits one conductivity type (p-type for example).

A diffusion layer is formed by diffusing phosphorus atoms or the like into the semiconductor substrate from the light-receiving surface thereof, thereby forming a region exhibiting the opposite conductivity type (n-type for example), on which is provided an antireflective film of silicon nitride or the like. An aluminum paste, silver paste or silver-aluminum paste is applied onto the substrate surface opposite the light-receiving surface and dried to form a rear electrode and a high-concentration p-type BSF layer. The conductive paste used in the present invention is then applied onto the aforementioned antireflective film by a conventional method such as screen printing, dried and fired for a total firing time of about 1 to 30 minutes at a peak temperature of 500 to 900° C. to decompose and remove the organic vehicle components and simultaneously form the front electrode, rear electrode and BSF layer. The front electrode and rear electrode do not have to be co-fired, and the front electrode can be formed after the rear electrode is fired, or the rear electrode can be formed after the front electrode is fired. The light-receiving surface of the semiconductor substrate preferably has a textured structure with a concave-convex surface {or pyramid-like asperities) in order to obtain better photoelectric conversion efficiency.

EXAMPLES

The present invention is explained in detail below by means of examples, but the present invention is not limited thereby.
1. Preliminary test
Preparation of Samples 1 to 130

Glass frit of the compositions shown in Table 1-1 to Table 1-4 in the part or parts ("part(s)" in the tables means the part or parts by weight of the added glass frit) shown in the tables per 100 parts by weight of silver powder was dispersed together with 100 parts by weight of silver powder in an organic vehicle composed of 1.6 parts by weight of ethyl cellulose and 6.4 parts by weight of butyl carbitol, to prepare conductive pastes (Samples 1 to 130). The ingredients in the glass compositions shown in the tables are all given in mol % as oxides.

The powders listed in the "silver powder" columns in the tables are as follows. The average particle size (D50) shown below corresponds to a weight-based cumulative 50% value in particle size distribution as measured with a laser diffraction particle size analyzer.

Silver powder X: Spherical powder,
average particle size D50=1.8 μm
Silver powder X: Spherical powder,
average particle size D50=1.5 μm
Silver powder Z: Spherical powder,
average particle size D50=2.6 μm Electrode Formation and Evaluation For initial evaluation of the conductive pastes thus prepared, contact resistance was measured as follows by the TLM (transmission line model) method.

First, 10 of 2 cm×2 cm square-shaped p-type silicon substrates with a pyramidal texture formed by alkali etching were prepared for each sample, phosphorus was diffused into each substrate from one principal surface (light-receiving surface) to form an n-type region (diffusion layer), and an SiN layer was formed thereon by plasma CVD to an average thickness of 75 nm.

Next, a plurality of front electrodes in the form of fine lines 100 μm wide and 15 μm thick were formed on the SiN layer with a pitch of 2 mm between the fine line-shaped electrodes, using Samples 1 to 130 prepared above, the resistance value between the fine line-shaped electrodes was measured with a digital multimeter (3458A Multimeter made by Hewlett Packard Co.), and the contact resistance was determined and used to evaluate the samples.

Note that the front electrodes were fired at a peak temperature of 800° C.

The results are shown together in Table 1-1 to Table 1-4. The symbols used in the "contact resistance" columns in the tables are as follows.

⊚ Average contact resistance for 10 substrates is less than 0.05 $\Omega cm^2$

○ Average contact resistance for 10 substrates is at least 0.05 $\Omega cm^2$ but less than 0.08 $\Omega cm^2$ Δ Average contact resistance for 10 substrates is at least 0.08 $\Omega cm^2$ but less than 0.10 $\Omega cm^2$ X Average contact resistance for 10 substrates is 0.10 $\Omega cm^2$ or more Next, the interface between the front electrode and the silicon substrate was observed in a TEM photograph and the structures were observed. FIGS. 3 and 4 show TEM photographs of Sample 1. As shown in FIGS. 3 and 4, a Te glass layer 9, a silicon oxide layer 10 and a SiN layer 2 were present between a front electrode layer 1a and a silicon substrate (or n-type diffusion layer) 4, and a structure composed of a series of fine silver particles 11 with a particle size of 100 nm or less were observed near the interface between the silicon oxide layer 10 and the SiN layer 2 (i.e., in the region adjacent to the SiN layer 2). Measurement with an energy dispersive X-ray spectroscopy (EDS) showed that the Te glass layer 9 contained a silver component, and a silver component was also detected in regions of silicon oxide layer 10 where no silver particles 11 precipitated.

When Samples 2 to 130 were observed in the same way with a TEM, they had similar structures to Sample 1, and even in those places where penetration was observed (although with less frequency than using conventional lead glass or the like), penetration through the SiN layer into the silicon substrate was less than 200 nm at most.

TABLE 1-1

| Sample | Ag powder | Glass part(s) | Te | W | Zn | Mo | Bi | Al | Ag | B | Zr | P | Ti | Li | Mg | Ta | Nb | Ba | La | Dy | Y | Si | Cu | Pb | Contact resistance |
|---|---|---|---|---|---|---|---|---|---|---|---|---|---|---|---|---|---|---|---|---|---|---|---|---|---|
| 1 | X | 2 parts | 40.0 | | | 50.0 | 10.0 | | | | | | | | | | | | | | | | | | ○ |
| 2 | X | 2 parts | 50.0 | | | 40.0 | 10.0 | | | | | | | | | | | | | | | | | | ○ |
| 3 | X | 2 parts | 60.0 | | | 20.0 | 20.0 | | | | | | | | | | | | | | | | | | ◎ |
| 4 | X | 2 parts | 60.0 | | | 25.0 | 15.0 | | | | | | | | | | | | | | | | | | ○ |
| 5 | X | 2 parts | 60.0 | | | 30.0 | 10.0 | | | | | | | | | | | | | | | | | | ◎ |
| 6 | X | 2 parts | 70.0 | | | 20.0 | 10.0 | | | | | | | | | | | | | | | | | | ○ |
| 7 | X | 2 parts | 50.0 | 40.0 | | | 10.0 | | | | | | | | | | | | | | | | | | ◎ |
| 8 | X | 2 parts | 60.0 | 20.0 | | | 20.0 | | | | | | | | | | | | | | | | | | ◎ |
| 9 | X | 2 parts | 60.0 | 30.0 | | | 10.0 | | | | | | | | | | | | | | | | | | ◎ |
| 10 | X | 2 parts | 60.0 | 35.0 | | | 5.0 | | | | | | | | | | | | | | | | | | ◎ |
| 11 | X | 2 parts | 70.0 | 20.0 | | | 10.0 | | | | | | | | | | | | | | | | | | ○ |
| 12 | X | 2 parts | 66.7 | 28.5 | | | | | | 4.8 | | | | | | | | | | | | | | | ○ |
| 13 | X | 2 parts | 50.0 | 25.0 | | | | | | | | | | 25.0 | | | | | | | | | | | ○ |
| 14 | X | 2 parts | 50.0 | 25.0 | | | | | | | | | | | 25.0 | | | | | | | | | | ○ |
| 15 | X | 2 parts | 50.0 | 25.0 | | | | | | | 25.0 | | | | | | | | | | | | | | ○ |
| 16 | X | 2 parts | 60.0 | 30.0 | | | | | | | | | | | | | | | | | 10.0 | | | | ○ |
| 17 | X | 2 parts | 70.0 | 20.0 | | | | | | | | | | | | | | | | | 10.0 | | | | ○ |
| 18 | X | 2 parts | 50.0 | 25.0 | | | | | | | | | | | | 25.0 | | | | | | | | | ○ |
| 19 | X | 2 parts | 60.0 | 30.0 | | | | | | | | | | | | | | | 10.0 | | | | | | ○ |
| 20 | X | 2 parts | 70.0 | 20.0 | | | | | | | | | | | | | | | 10.0 | | | | | | ○ |
| 21 | X | 2 parts | 60.0 | 30.0 | | | | | | | | | | | | | | | | 10.0 | | | | | ○ |
| 22 | X | 2 parts | 70.0 | 20.0 | | | | | | | | | | | | | | | | 10.0 | | | | | ○ |
| 23 | X | 2 parts | 50.0 | 25.0 | | | | | | | | | | | | | | 25.0 | | | | | | | ○ |
| 24 | X | 2 parts | 70.0 | | | 20.0 | | | | | | | | | | | | | 10.0 | | | | | | ○ |
| 25 | X | 2 parts | 50.0 | | 25.0 | | | | | | | | | | | | | | 25.0 | | | | | | ○ |
| 26 | Y | 2 parts | 40.0 | 20.0 | | | 6.7 | | 33.3 | | | | | | | | | | | | | | | | ◎ |
| 27 | X | 2 parts | 50.0 | 40.0 | | | 10.0 | | | | | | | | | | | | | | | | | | ○ |
| 28 | Y | 2 parts | 50.0 | 25.0 | | | 8.3 | | 16.7 | | | | | | | | | | | | | | | | ◎ |
| 29 | Y | 2 parts | 54.5 | 27.3 | | | 9.1 | | 9.1 | | | | | | | | | | | | | | | | ◎ |
| 30 | Y | 2 parts | 54.5 | 27.3 | | | 9.1 | | | | 9.1 | | | | | | | | | | | | | | ○ |
| 31 | Y | 2 parts | 54.5 | 27.3 | | | 9.1 | | | | | 9.1 | | | | | | | | | | | | | ○ |
| 32 | X | 2 parts | 55.8 | 32.5 | | | 4.7 | | | 2.3 | 4.7 | | | | | | | | | | | | | | ○ |
| 33 | Y | 2 parts | 55.8 | 27.9 | | | 9.3 | 7.0 | | | | | | | | | | | | | | | | | ○ |
| 34 | Y | 2 parts | 57.1 | 28.6 | | | 9.5 | 4.8 | | | | | | | | | | | | | | | | | |
| 35 | Y | 2 parts | 57.1 | 28.6 | | | 9.5 | | | | 4.8 | | | | | | | | | | | | | | |
| 36 | Y | 2 parts | 57.1 | 28.6 | | | 9.5 | | | | | 4.8 | | | | | | | | | | | | | |
| 37 | Y | 2 parts | 58.0 | 29.0 | | | 9.6 | 3.4 | | | | | | | | | | | | | | | | | |
| 38 | Y | 2 parts | 58.3 | 29.1 | | | 9.7 | | | | | | | | | | | | | | | | | | |

TABLE 1-1-continued

| Sample | Ag powder | Glass part(s) | | Contact resistance |
|---|---|---|---|---|
| 34 | Y | 2 parts | | ○ |
| 35 | Y | 2 parts | | ◎ |
| 36 | Y | 2 parts | | ○ |
| 37 | Y | 2 parts | | ○ |
| 38 | Y | 2 parts | 2.9 | ◎ |

TABLE 1-2

| Sample | Ag powder | Glass part(s) | Glass composition | | | | | | | | | | | | | | | | | | | | | | Contact resistance |
|---|---|---|---|---|---|---|---|---|---|---|---|---|---|---|---|---|---|---|---|---|---|---|---|---|---|
| | | | Te | W | Zn | Mo | Bi | Al | Ag | B | Zr | P | Ti | Li | Mg | Ta | Nb | Ba | La | Dy | Y | Si | Cu | Pb | |
| 39 | Y | 2 parts | 58.5 | 29.3 | | | 9.8 | 2.4 | | | | | | | | | | | | | | | | | ◎ |
| 40 | Y | 2 parts | 58.5 | 29.3 | | | 9.8 | | | 2.4 | | | | | | | | | | | | | | | ◎ |
| 41 | Y | 2 parts | 58.5 | 29.3 | | | 9.8 | | | | 2.4 | | | | | | | | | | | | | | ◎ |
| 42 | Y | 2 parts | 58.8 | 29.4 | | | 9.8 | | | | | | | | | | | | | | | | 2.0 | | ◎ |
| 43 | X | 2 parts | 60.0 | 25.0 | | | 15.0 | | | | | | | | | | | | | | | | | | ◎ |
| 44 | Y | 2 parts | 60.0 | 25.0 | | | 15.0 | | | | | | | | | | | | | | | | | | ○ |
| 45 | X | 2 parts | 60.0 | 30.0 | | | 10.0 | | | | | | | | | | | | | | | | | | ○ |
| 46 | Y | 2 parts | 60.0 | 30.0 | | | 10.0 | | | | | | | | | | | | | | | | | | ◎ |
| 47 | X | 2 parts | 65.1 | 18.6 | | | 9.3 | | | 2.3 | 4.7 | | | | | | | | | | | | | | ◎ |
| 48 | Y | 2 parts | 65.1 | 23.2 | | | 4.7 | | | 2.3 | 4.7 | | | | | | | | | | | | | | ○ |
| 49 | X | 2 parts | 68.3 | 19.5 | | | 9.8 | | | | 2.4 | | | | | | | | | | | | | | ○ |
| 50 | Y | 2 parts | 40.0 | | | 20.0 | 6.7 | | 33.3 | | | | | | | | | | | | | | | | ◎ |
| 51 | Y | 2 parts | 46.7 | | | 13.3 | 6.7 | | 33.3 | | | | | | | | | | | | | | | | ◎ |
| 52 | X | 2 parts | 55.8 | | | 27.9 | 9.3 | | | 2.3 | 4.7 | | | | | | | | | | | | | | ◎ |
| 53 | Y | 2 parts | 55.8 | | | 27.9 | 9.3 | | | 2.3 | 4.7 | | | | | | | | | | | | | | ◎ |
| 54 | Y | 2 parts | 58.3 | | | 16.7 | 8.3 | | 16.7 | | | | | | | | | | | | | | | | ◎ |
| 55 | Y | 2 parts | 60.0 | | | 30.0 | 10.0 | | | | | | | | | | | | | | | | | | ◎ |
| 56 | Y | 2 parts | 63.6 | | | 18.2 | 9.1 | | 9.1 | | | | | | | | | | | | | | | | ○ |
| 57 | Y | 2 parts | 40.0 | 20.0 | 20.0 | 20.0 | | | | | | | | | | | | | | | | | | | ○ |
| 58 | Y | 2 parts | 50.0 | 30.0 | 10.0 | | 10.0 | | | | | | | | | | | | | | | | | | ◎ |
| 59 | Y | 2 parts | 60.0 | 20.0 | 10.0 | | 10.0 | | | | | | | | | | | | | | | | | | ○ |
| 60 | Y | 2 parts | 60.0 | 25.0 | 5.0 | | 10.0 | | | | | | | | | | | | | | | | | | ○ |
| 61 | Y | 2 parts | 31.7 | 15.9 | 15.9 | | | | 31.7 | 1.6 | 3.2 | | | | | | | | | | | | | | |
| 62 | Y | 2 parts | 33.3 | 16.7 | 16.7 | | | | 33.3 | | | | | | | | | | | | | | | | |
| 63 | Y | 2 parts | 37.2 | 37.2 | 18.6 | | | | | | 2.3 | 4.7 | | | | | | | | | | | | | |
| 64 | Y | 2 parts | 41.7 | 20.8 | 20.8 | | | | 16.7 | | | | | | | | | | | | | | | | |
| 65 | Y | 2 parts | 41.8 | 32.6 | 18.6 | | | | | | 2.3 | 4.7 | | | | | | | | | | | | | |
| 66 | X | 2 parts | 44.5 | 22.2 | 22.2 | | 4.4 | | | | 2.3 | 4.4 | | | | | | | | | | | | | |
| 67 | X | 2 parts | 45.3 | 22.6 | 22.6 | | 2.7 | | | | 2.3 | 4.5 | | | | | | | | | | | | | |
| 68 | X | 2 parts | 45.5 | 22.7 | 22.7 | | | | | | | | | | | | | | | | | | | | |
| 69 | Y | 2 parts | 45.5 | 22.7 | 22.7 | | | | | 9.1 | | | | | | | | | | | | | | | |
| 70 | X | 2 parts | 45.5 | 22.7 | 22.7 | | | | | | | 9.1 | | | | | | | | | | | | | |
| 71 | X | 2 parts | 45.5 | 22.7 | 22.7 | | | | | | | | 9.1 | | | | | | | | | | | | |
| 72 | X | 2 parts | 47.6 | 23.8 | 23.8 | | | | | | | 4.8 | | | | | | | | | | | | | |
| 73 | X | 2 parts | 48.8 | 24.4 | 24.4 | | | | | | | | 2.4 | | | | | | | | | | | | |
| 74 | X | 2 parts | 46.2 | 23.0 | 23.0 | | 0.9 | | | | 2.3 | 4.6 | | | | | | | | | | | | | |
| 75 | X | 2 parts | 46.4 | 23.3 | 23.3 | | | | | | 2.3 | 4.7 | | | | | | | | | | | | | |
| 76 | Y | 2 parts | 46.5 | 37.2 | 9.3 | | | | | | 2.3 | 4.7 | | | | | | | | | | | | | |

TABLE 1-2-continued

| Sample | Ag powder | Glass part(s) | | Contact Resistance |
|---|---|---|---|---|
| 61 | Y | 2 parts | | ◎ |
| 62 | Y | 2 parts | | ○ |
| 63 | Y | 2 parts | | ○ |
| 64 | Y | 2 parts | | ◎ |
| 65 | Y | 2 parts | | ◎ |
| 66 | X | 2 parts | | ○ |
| 67 | X | 2 parts | | ○ |
| 68 | X | 2 parts | 9.1 | ◎ |
| 69 | Y | 2 parts | | ◎ |
| 70 | X | 2 parts | | ◎ |
| 71 | X | 2 parts | | ◎ |
| 72 | X | 2 parts | | ◎ |
| 73 | X | 2 parts | | ◎ |
| 74 | X | 2 parts | | ○ |
| 75 | X | 2 parts | | ◎ |
| 76 | Y | 2 parts | | ○ |

TABLE 1-3

| Sample | Ag powder | Glass part(s) | Te | W | Zn | Mo | Bi | Al | Ag | B | Zr | P | Ti | Li | Mg |
|---|---|---|---|---|---|---|---|---|---|---|---|---|---|---|---|
| 77 | X | 2 parts | 47.6 | 23.8 | 23.8 | | | | | | | | | | |
| 78 | X | 2 parts | 50.0 | 25.0 | 26.0 | | | | | | | | | | |
| 79 | Y | 2 parts | 60.0 | 25.0 | 25.0 | | | | | | | | | | |
| 80 | Z | 2 parts | 50.0 | 25.0 | 25.0 | | | | | | | | | | |
| 81 | Y | 2 parts | 51.1 | 32.6 | 9.3 | | | | | 2.3 | 4.7 | | | | |
| 82 | X | 0.6 part | 46.4 | 23.3 | 23.3 | | | | | 2.3 | 4.7 | | | | |
| 83 | Y | 2.5 parts | 46.4 | 23.3 | 23.3 | | | | | 2.3 | 4.7 | | | | |
| 84 | Z | 2.5 parts | 46.4 | 23.3 | 23.3 | | | | | 2.3 | 4.7 | | | | |
| 86 | X | 1.6 parts | 50.0 | 25.0 | 25.0 | | | | | | | | | | |
| 86 | Y | 1.5 parts | 50.0 | 25.0 | 25.0 | | | | | | | | | | |
| 87 | Z | 1.5 parts | 60.0 | 25.0 | 26.0 | | | | | | | | | | |
| 88 | Y | 3 parts | 60.0 | 26.0 | 25.0 | | | | | | | | | | |
| 89 | Y | 1 part | 40.0 | 20.0 | | | 6.7 | | 33.3 | | | | | | |
| 90 | Y | 1 part | 50.0 | 25.0 | | | 8.3 | | 16.7 | | | | | | |
| 91 | Y | 1 part | 54.5 | 27.3 | | | 9.1 | | 9.1 | | | | | | |
| 92 | Y | 1 part | 54.6 | 27.3 | | | 9.1 | 9.1 | | | | | | | |
| 93 | Y | 1.5 parts | 54.6 | 27.3 | | | 9.1 | | | | | | | 9.1 | |
| 94 | Y | 1.5 parts | 54.5 | 27.3 | | | 9.1 | | 9.1 | | | | | | |
| 95 | Y | 1.5 parts | 54.5 | 27.3 | | | 9.1 | | | | | | | | |
| 96 | Y | 1 part | 57.1 | 28.6 | | | 9.5 | | | 4.8 | | | | | |
| 97 | Y | 1 part | 57.1 | 28.6 | | | 9.5 | | | | 4.8 | | | | |
| 98 | Y | 1 part | 57.1 | 28.6 | | | 9.5 | 4.8 | | | | | | | |
| 99 | Y | 1.5 parts | 57.1 | 28.6 | | | 9.5 | | | | | | 4.8 | | |
| 100 | Y | 1.5 parts | 57.1 | 28.6 | | | 9.5 | | | | | 4.8 | | | |
| 101 | Y | 1.5 parts | 57.1 | 28.6 | | | 9.5 | | | 4.8 | | | | | |
| 102 | Y | 1.5 parts | 57.1 | 28.6 | | | 9.5 | | | | 4.8 | | | | |
| 103 | Y | 1.5 parts | 57.1 | 28.6 | | | 9.5 | 4.8 | | | | | | | |
| 104 | Y | 1.5 parts | 57.1 | 28.6 | | | 9.5 | | | | | | | | |
| 105 | Y | 1.5 parts | 58.3 | 29.1 | | | 9.7 | | | | | | | | |
| 106 | Y | 1.5 parts | 58.3 | 29.1 | | | 9.7 | | | | | | | | |
| 107 | Y | 1 part | 58.5 | 29.3 | | | 9.8 | 2.4 | | | | | | | |
| 108 | Y | 1 part | 58.5 | 29.3 | | | 9.8 | | | 2.4 | | | | | |
| 109 | Y | 1 part | 58.5 | 29.3 | | | 9.8 | | | | 2.4 | | | | |
| 110 | Y | 1.5 parts | 58.5 | 29.3 | | | 9.8 | 2.4 | | | | | | | |
| 111 | Y | 1.5 parts | 58.5 | 29.3 | | | 9.8 | | | 2.4 | | | | | |
| 112 | Y | 1.5 parts | 58.5 | 29.3 | | | 9.8 | | | | 2.4 | | | | |
| 113 | Y | 1.5 parts | 59.4 | 29.7 | | | 9.9 | | | | | | | | |
| 114 | Y | 1.5 parts | 59.4 | 29.7 | | | 9.9 | | | | | | | | |

| Sample | Ag Powder | Glass part(s) | Ta | Nb | Ba | La | Dy | Y | Si | Cu | Pb | Contact Resistance |
|---|---|---|---|---|---|---|---|---|---|---|---|---|
| 77 | X | 2 parts | | | | | | | 4.8 | | | ○ |
| 78 | X | 2 parts | | | | | | | | | | ◎ |
| 79 | Y | 2 parts | | | | | | | | | | ◎ |
| 80 | Z | 2 parts | | | | | | | | | | ◎ |
| 81 | Y | 2 parts | | | | | | | | | | ◎ |
| 82 | X | 0.6 part | | | | | | | | | | ○ |
| 83 | Y | 2.5 parts | | | | | | | | | | ◎ |
| 84 | Z | 2.5 parts | | | | | | | | | | ◎ |
| 86 | X | 1.6 parts | | | | | | | | | | ○ |
| 86 | Y | 1.5 parts | | | | | | | | | | ◎ |
| 87 | Z | 1.5 parts | | | | | | | | | | ◎ |

TABLE 1-3-continued

| Sample | Ag powder | Glass part(s) | | | | | Contact resistance |
|---|---|---|---|---|---|---|---|
| 88 | Y | 3 parts | | | | | ◎ |
| 89 | Y | 1 part | | | | | ◎ |
| 90 | Y | 1 part | | | | | ○ |
| 91 | Y | 1 part | | | | | ○ |
| 92 | Y | 1 part | | | | | ○ |
| 93 | Y | 1.5 parts | | | | | ◎ |
| 94 | Y | 1.5 parts | | | | | ◎ |
| 95 | Y | 1.5 parts | | | | 9.1 | ○ |
| 96 | Y | 1 part | | | | | ◎ |
| 97 | Y | 1 part | | | | | ◎ |
| 98 | Y | 1 part | | | | | ○ |
| 99 | Y | 1.5 parts | | | | | ○ |
| 100 | Y | 1.5 parts | | | | | ○ |
| 101 | Y | 1.5 parts | | | | | ○ |
| 102 | Y | 1.5 parts | | | | | ◎ |
| 103 | Y | 1.5 parts | | | | | ○ |
| 104 | Y | 1.5 parts | | | | 4.8 | ○ |
| 105 | Y | 1.5 parts | 2.9 | | | | ◎ |
| 106 | Y | 1.5 parts | | | | 2.9 | ◎ |
| 107 | Y | 1 part | | | | | ◎ |
| 108 | Y | 1 part | | | | | ◎ |
| 109 | Y | 1 part | | | | | ◎ |
| 110 | Y | 1.5 parts | | | | | ◎ |
| 111 | Y | 1.5 parts | | | | | ◎ |
| 112 | Y | 1.5 parts | | | | | ◎ |
| 113 | Y | 1.5 parts | | | 1.0 | | ◎ |
| 114 | Y | 1.5 parts | 1.0 | | | | ◎ |

TABLE 1-4

| Sample | Ag powder | Glass part(s) | Te | W | Zn | Mo | Bi | Al | Ag | B | Zr | P | Ti | Li | Mg | Ta | Nb | Ba | La | Dy | Y | Si | Cu | Pb | Contact resistance |
|---|---|---|---|---|---|---|---|---|---|---|---|---|---|---|---|---|---|---|---|---|---|---|---|---|---|
| 115 | Y | 1.5 parts | 59.4 | 29.7 | | | 9.9 | | | | | | 1.0 | | | | | | | | | | | | ○ |
| 116 | Y | 1.5 parts | 59.4 | 29.7 | | | 9.9 | | | | | | | | | | | | | | | 1.0 | | | ◎ |
| 117 | Y | 1.5 parts | 59.6 | 29.9 | | | 10.0 | | | | | | | | | | | 0.5 | | | | | | | ○ |
| 118 | Y | 1.5 parts | 59.6 | 29.9 | | | 10.0 | | | | | | | | | | 0.5 | | | | | | | | ◎ |
| 119 | Y | 1 part | 60.0 | 30.0 | | | 10.0 | | | | | | | | | | | | | | | | | | ◎ |
| 120 | Y | 1.5 parts | 60.0 | 30.0 | | | 10.0 | | | | | | | | | | | | | | | | | | ○ |
| 121 | Y | 1 part | 60.0 | 30.0 | | | 10.0 | | | | | | | | | | | | | | | | | | ◎ |
| 122 | Y | 1.5 parts | 60.0 | 30.0 | | | 10.0 | | | | | | | | | | | | | | | | | | ◎ |
| 123 | Y | 1 part | 60.0 | 25.0 | | | 15.0 | | | | | | | | | | | | | | | | | | ◎ |
| 124 | Y | 1.5 parts | 60.0 | 25.0 | | | 15.0 | | | | | | | | | | | | | | | | | | ◎ |
| 125 | Y | 1.5 parts | 40.0 | 20.0 | | | 6.7 | | 33.3 | | | | | | | | | | | | | | | | ◎ |
| 126 | Y | 1.5 parts | 50.0 | 25.0 | | | 8.3 | | 16.7 | | | | | | | | | | | | | | | | ◎ |
| 127 | Y | 1 part | 60.0 | | | 30.0 | 10.0 | | | | | | | | | | | | | | | | | | ◎ |
| 128 | Y | 1.5 parts | 60.0 | | | 30.0 | 10.0 | | | | | | | | | | | | | | | | | | ◎ |
| 129 | Y | 1 part | 60.0 | | | 30.0 | 10.0 | | | | | | | | | | | | | | | | | | |
| 130 | Y | 1.5 parts | 60.0 | | | 30.0 | 10.0 | | | | | | | | | | | | | | | | | | |
| Comp. Sample 1 | Y | 3 parts | | | | | | | 2.0 | | | | | | | | | | | | | | | | |
| Comp. Sample 2 | Y | 2 parts | | | 20.0 | | 60.0 | | | | | | | | | | | | | | | | | | |

TABLE 1-4-continued

| | | | | | |
|---|---|---|---|---|---|
| 129 | Y | 1 part | | | ⊚ |
| 130 | Y | 1.5 parts | | | ⊚ |
| Comp. Sample 1 | Y | 3 parts | 38.0 | 60.0 | ⊚ |
| Comp. Sample 2 | Y | 2 parts | 20.0 | | Δ |

Evaluation of Comparative Samples 1-2

For purposes of comparison, the same preliminary test was performed using lead glass and bismuth glass of the compositions shown in Table 1-4. The ingredients in the glass compositions shown in the table are all given in mol % as oxides. The resulting contact resistance values are shown in Table 1-4.

When the interface between the front electrode and the silicon substrate was observed in a TEM photograph in the same way as described above, a glass layer was observed between the front electrode layer and SiN layer as in FIG. 2, and part of this glass layer penetrated through the SiN layer into the silicon substrate (fire-through). In the case of Comparative Sample 2 in particular, deep penetration of more than 300 nm was observed from the SiN layer into the silicon substrate.

The resulting solar cell devices were subjected to I-V curve measurement using a solar simulator (WXS-50S-1.5, AM 1.5 G made by WACOM ELECTRIC Co., Ltd.) and high-current source meter (Model 2400 made by KEITHLEY INSTRUMENTS, INC.) to determine the open circuit voltage (Voc), short-circuit current density (Jsc), fill factor (FF), maximum power output (Pmax) and conversion efficiency (Eff), with the results shown in Table 2.

To be thorough, the interfaces between the front electrodes and the silicon substrates in the devices fired at 760° C. and 780° C. were observed in a TEM photograph as in the preliminary test, but as seen in Sample 1, penetration through the SiN layer into the silicon substrate was hardly observed or was not observed at all, and the maximum depth of penetration through the SiN layer into the silicon substrate was very shallow-less than 200 nm.

TABLE 2

| Sample | Ag powder | Glass part(s) | Glass composition | | | | | | | Firing temperature | Voc [V] | Jsc [mA·cm$^{-2}$] | FF | Pmax [mW] | Eff [%] |
|---|---|---|---|---|---|---|---|---|---|---|---|---|---|---|---|
| | | | Te | W | Zn | Bi | B | Si | Pb | | | | | | |
| 44 | Y | 2 parts | 60.0 | 25.0 | 15.0 | | | | | 760° C. | 0.608 | 34.83 | 0.727 | 61.61 | 15.40 |
| | | | | | | | | | | 780° C. | 0.603 | 34.19 | 0.717 | 59.11 | 14.78 |
| | | | | | | | | | | 800° C. | 0.594 | 30.37 | 0.724 | 52.26 | 13.07 |
| 123 | Y | 1 part | 60.0 | 25.0 | 15.0 | | | | | 760° C. | 0.604 | 32.39 | 0.758 | 59.31 | 14.83 |
| | | | | | | | | | | 780° C. | 0.600 | 31.98 | 0.763 | 58.53 | 14.63 |
| | | | | | | | | | | 800° C. | 0.600 | 32.35 | 0.761 | 59.10 | 14.77 |
| 79 | Y | 2 parts | 50.0 | 25.0 | 25.0 | | | | | 760° C. | 0.605 | 32.58 | 0.766 | 60.38 | 15.10 |
| | | | | | | | | | | 780° C. | 0.603 | 32.30 | 0.776 | 60.46 | 15.11 |
| | | | | | | | | | | 800° C. | 0.605 | 31.57 | 0.774 | 59.14 | 14.78 |
| 88 | Y | 3 parts | 50.0 | 25.0 | 25.0 | | | | | 760° C. | 0.603 | 32.32 | 0.756 | 58.89 | 14.72 |
| | | | | | | | | | | 780° C. | 0.604 | 32.39 | 0.758 | 59.31 | 14.83 |
| | | | | | | | | | | 800° C. | 0.606 | 35.26 | 0.766 | 60.45 | 15.11 |
| Comp. Sample 1 | Y | 3 parts | | | | | 2.0 | 38.0 | 60.0 | 800° C. | 0.606 | 32.98 | 0.770 | 61.56 | 15.39 |
| Comp. Sample 2 | Y | 2 parts | | | 20.0 | 60.0 | | 20.0 | | 800° C. | 0.593 | 32.17 | 0.593 | 45.24 | 11.31 |

2. Evaluation of Solar Cell Device Characteristics

As in the preliminary test, an n-type diffusion layer and a SiN layer were formed in that order on one principal surface (light-receiving surface) of a 2 cm×2 cm p-type silicon substrate with a pyramidal textured structure formed by alkali etching, and a rear electrode was formed with an aluminum paste onto the rear surface of the substrate on the opposite side, after which a comb-shaped pattern was printed on the SiN layer using each of the aforementioned Samples 44, 79, 88 and 123 so as to obtain a comb-shaped front electrode (line width: 100 μm, thickness: 15 μm, pitch between lines: 2 mm) after firing, and was fired at a peak temperature of 800° C. to form the front electrode and prepare a solar cell device.

The same samples were also used to form comb-shaped patterns which were fired at peak temperatures of 760° C. and 780° C. to prepare solar cell devices different only in terms of firing temperature.

Comb-shaped patterns were also formed with Comparative Samples 1 and 2, and fired at a peak temperature of 800° C. to prepare solar cell devices.

As clear from the results shown in Table 2, it was confirmed that the solar cell devices obtained with the present invention had low dependency on firing temperature, as well as excellent solar cell characteristics.

What is claimed is:

1. A solar cell device including a front electrode formed by applying a conductive paste containing a conductive powder comprising silver as a main component, tellurium glass frit containing 30 to 90 mol % of tellurium oxide and an organic vehicle onto a semiconductor substrate having a silicon nitride layer provided on a surface thereof and firing the applied conductive paste, wherein the organic vehicle is removed during the firing and the front electrode has a structure comprising an electrode layer containing silver from the conductive powder as a main component, a glass layer containing tellurium glass formed from the glass frit as a main component and a silicon oxide layer containing silver particles precipitated by the firing from the conductive powder.

2. The solar cell device according to claim 1, wherein the silver particles are precipitated near an interface between the silicon oxide layer and the silicon nitride layer.

3. The solar cell device according to claim 1, wherein the silver particles are fine particles with a particle size of less than or equal to 100 nm.

4. The solar cell device according to claim 2, wherein the silver particles are fine particles with a particle size of less than or equal to 100 nm.

5. A method for manufacturing a solar cell device, comprising forming the front electrode described in claim 1 by applying a conductive paste containing a conductive powder comprising silver as a main component, tellurium glass frit and an organic vehicle onto a semiconductor substrate provided with a silicon nitride layer on a surface thereof and firing the applied conductive paste, wherein the organic vehicle is removed during the firing and the tellurium glass frit contains 30 to 90 mol % of tellurium oxide.

\* \* \* \* \*